United States Patent [19]

Liu

[11] 4,262,070

[45] Apr. 14, 1981

[54] METHOD OF MAKING HALFTONE CONTACT SCREENS

[76] Inventor: Hua-Kuang Liu, 35 Woodland Forest P.O. Box 5620, Tuscaloosa, Ala. 35405

[21] Appl. No.: 141,651

[22] Filed: Apr. 18, 1980

Related U.S. Application Data

[63] Continuation-in-part of Ser. No. 960,446, Nov. 13, 1978, abandoned, which is a continuation of Ser. No. 708,539, Jul. 26, 1976, abandoned.

[51] Int. Cl.$^3$ ............................ G03C 5/00; G03F 5/00
[52] U.S. Cl. ........................................ 430/6; 350/322; 355/125; 430/394; 430/396
[58] Field of Search ....................... 430/6, 7, 394, 396, 430/321; 350/322; 355/125

[56] References Cited

U.S. PATENT DOCUMENTS

| | | | |
|---|---|---|---|
| 2,292,313 | 8/1942 | Yule | 350/322 |
| 2,719,790 | 10/1955 | Monroy | 350/322 |
| 3,555,527 | 2/1971 | Crespi | 355/125 X |
| 3,647,471 | 3/1972 | Thompson | 430/6 |
| 3,737,321 | 6/1973 | Torr et al. | 350/322 |
| 3,928,038 | 12/1975 | Bergin | 430/6 X |
| 4,138,253 | 2/1979 | Farrand | 430/22 |
| 4,188,225 | 2/1980 | Liu | 430/7 |

*Primary Examiner*—Edward C. Kimlin
*Attorney, Agent, or Firm*—Isaac P. Espy

[57] ABSTRACT

A method of making a halftone contact screen having a plurality of discrete different optical transmittance levels by making multiple relative translations of light-sensitive material under and in close contact with a ruling mask while exposures to light through the ruling mask are made between the translations. The mask comprises a thin flat plate having an array of parallel periodic equal width opaque straight bars separated by an array of parallel equal width transparent bars. In a first process, translations are normally made perpendicular to the parallel of the bars. Two-dimensional or dot halftone contact screens are made by repeating the process wherein the light-sensitive material is rotated relative to the ruling mask, in its own plane, at an angle greater than zero to the direction of the ruling bars during the first process. Using the single process creates a line halftone contact screen; adding the second process creates a dot halftone contact screen. The effective translation distance between two successive exposures is a non-integral multiple of half of the total width of a single pair of opaque and transparent bars in the ruling mask.

19 Claims, 5 Drawing Figures

| 2 | 3 | 4 | 4 | 3 | 2 |
|---|---|---|---|---|---|
| 3 | 4 | 5 | 5 | 4 | 3 |
| 4 | 5 | 6 | 6 | 5 | 4 |
| 4 | 5 | 6 | 6 | 5 | 4 |
| 3 | 4 | 5 | 5 | 4 | 3 |
| 2 | 3 | 4 | 4 | 3 | 2 |

| 2 | 3 | 4 | 4 | 3 | 2 |
|---|---|---|---|---|---|
| 3 | 4 | 5 | 5 | 4 | 3 |
| 4 | 5 | 6 | 6 | 5 | 4 |
| 4 | 5 | 6 | 6 | 5 | 4 |
| 3 | 4 | 5 | 5 | 4 | 3 |
| 2 | 3 | 4 | 4 | 3 | 2 |

FIG. 3

METHOD OF MAKING HALFTONE CONTACT SCREENS

RELATED CASES

This application is a continuation-in-part of co-pending U.S. application Ser. No. 960,446 filed Nov. 13, 1978, now abandoned, which is a continuation application of Ser. No. 708,539, filed July 26, 1976, now abandoned, entitled "Method of Making Halftone Screens."

BACKGROUND OF THE INVENTION

The present invention relates to halftone contact screens for the reproduction of images by photographic printing, and other reproduction processes. More specifically, the invention relates to a novel halftone screen and the method of its manufacture.

DESCRIPTION OF THE PRIOR ART

Halftone screens are necessary in the reproduction of images such as photographic prints or negatives. Usually, printing plates or engravings consisting of an array of solid opaque dots are produced in halftone contact screens composed of an array of vignetted, density varying, continuous-tone unit cell patterns (for example, in square, round, or elliptical patterns). The size and spacing of the solid dots in each portion of the halftone printing plate or engraving will vary in accordance with the average shade value of the corresponding portion of the images to be reproduced. It is the surfaces of these dots which receive the printing ink in the printing process. The transmittance of the cells of the halftone contact screens in combination with the image transmittance determine the size and shape of the solid dots in the printing plates.

The making of halftone contact screens usually involves elaborate, expensive equipment and a large number of carefully controlled steps. Heretofore, techniques for making high quality halftone screens were extremely difficult and required experienced and skilled artisans working with costly equipment.

For example, in the method of photographic reproduction of halftone screens disclosed in U.S. Pat. No. 3,647,471 to Edward R. Thompson, which issued Mar. 7, 1972, it is first necessary to make a photographic master from which the halftone screens are made. The master has on it a number of closely spaced parallel lines. An unexposed light sensitive plate is placed in contact with the master and the master is exposed onto the plate by means of a light source. This produces a plate with a plurality of closely spaced parallel lines. The same procedure is followed to produce another plate. The plates are then rotated and sandwiched together to form a right-angled grid pattern. The screen is, however, not a contact screen and its usage is difficult. In addition, as can be seen, this is a very complicated process and requires a great deal of skill and care in preparing the plates and in providing for the registration between the plates when sandwiched together. This is costly and subject to error.

The same patent discloses a way of producing halftone screens from photographic film. An unexposed piece of film is placed in contact with the master. The master is exposed onto the film by means of a light source. The master is then removed and rotated 90 degrees to its original position to expose the film again by means of the light source. The film is then developed producing a halftone screen with a square grid pattern. But, again, the result is not a contact screen.

This technique produces a very simple grid pattern halftone screen but does not concern itself with the problem of controlling the density of the unit cells, the shape of the unit cells, or the size of the unit cells in the resultant halftone screen. This is important with respect to the reproduction of photographs having wide dynamic range and high contrast.

Various techniques have been disclosed in the past utilizing a square grid-shaped screen to achieve varying intensities. For example, in U.S. Pat. Nos. 2,282,337, Mies et al, and 2,532,585, Van DerRhoe et al, there is disclosed a method of exposing a large picture from small halftone screens which utilizes square grid patterns. These patents teach the moving of the negative and the halftone screen to produce photographs or new halftone screens with or without varying intensities. For example, in U.S. Pat. No. 2,532,585 the film is moved a distance D which is equal to the width of the entire halftone screen so that a photograph which is much larger than the halftone screen can be reproduced. These patents do not teach a method of making (one-dimensional) line halftone screens by means of a simple and easily duplicated manufacturing technique.

It is important to point out that a step-and-repeat type exposure method was disclosed in U.S. Pat. No. 4,138,253 of Farrand for the making of an improved member of a position measuring transducer wherein the improved member has a pattern of uniformly pitched bars. As explained in Farrand's patent (lines 39–44 of column 3, and (d) and (e) of claim 1, column 10), Farrand taught the shifting of an integer multiple of one whole pitch distance (on the average) of an initially non-uniform pattern on a photo-sensitive material for a pre-determined exposure step level; repeating the preceding imaging and shifting steps an unspecified plurality of times. This is absolutely different from the present invention which discloses that the light sensitive material traverses relative to an already uniform-pitched ruling mask a distance that effectively is a non-integral multiple or a fraction of a pitch between exposures. The two inventions also have different goals.

It is therefore a primary object of the present invention to provide an improved halftone contact screen and a method of producing the screen which may either have line or dot (one or two-dimensional) cell patterns of measurable and discretely controllable optical transmittance profiles.

It is a further object of this invention to provide a method of manufacturing a halftone screen in which the shape and size of the unit cells can be accurately determined to satisfy the purpose of any specific halftone screen application.

It is a further object of this invention to provide a halftone screen with the profiles of optical transmittances of the unit cells controllable by its manufacturing technique.

SUMMARY OF THE INVENTION

Briefly, the above objects are accomplished in accordance with the invention by closely contact-exposing light sensitive material through a mask having an array of parallel, periodic equal width opaque straight bars separated by transparent bars for a first predetermined period of time, changing the relative translational position of the light-sensitive material and the mask such that the light-sensitive material is translated along a direction making an angle $\theta$ ($0° < \theta \leq 90°$) with respect to the parallel of the bars by a distance d where $d\sin\theta$ is a non-integral multiple of half of the center-to-center distance between two adjacent opaque bars. The light-sensitive material is then exposed through the mask for a second period of time. A similar translation-exposure process continues for a predetermined number of times. The light-sensitive material is developed to thereby produce a halftone contact screen with optical transmittance varying along one direction, the direction of translation, only. This screen is called a one-dimensional screen or a line screen.

Another aspect of the invention contemplates making dot (two-dimensional) halftone contact screens by first exposing according to the above-mentioned manner along one direction. A similar translation-exposure process is then performed again after first changing the orientation of the light-sensitive material relative to the mask, in its original plane to another direction. The translation-exposure steps can be performed for any predetermined number of different relative angular positions between the mask and light-sensitive material. The developed material becomes a two-dimensional or dot halftone contact screen.

The invention has the advantage that the cell optical transmittance patterns are discretely controllable and thereby produce predictable optical transmittance profiles.

The invention has a further advantage that the shape and size of the unit cells can be accurately determined depending upon the particular application such as for the printing industry and graphic arts, for image enhancement applications, for pattern recognition or image processing applications, for the making of improved television masks and screens, and for many other analog-to-digital conversion processes in which halftone screens are employed.

The foregoing and other objects, features and advantages of the invention will become apparent from the following more particular description of the preferred embodiments of the invention as illustrated in the accompanying drawings.

BRIEF DESCRIPTION OF THE DRAWINGS

FIG. 3 is an enlarged view of a unit cell of a (two-dimensional) dot halftone contact screen in which the unit cell has 5 gray levels denoted by the numbers 2 through 6.

DESCRIPTION OF PREFERRED EMBODIMENTS

Figure 1:
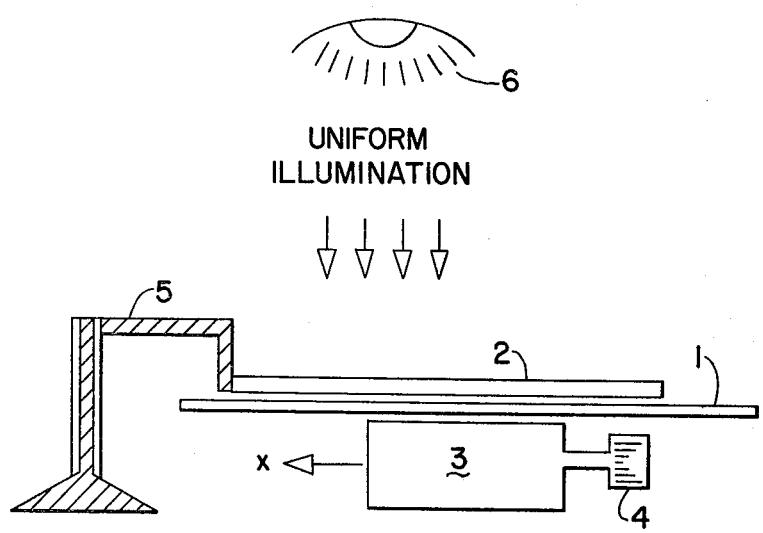
FIG. 1 is a side view of an apparatus and light source employed to produce halftone contact screens in accordance with the present invention.

Referring now to FIG. 1, the method of fabricating a (one-dimensional) line halftone screen will first be described. The apparatus is comprised of a stand 5 upon which a thin flat ruling mask 2 is held in place. The mask has an array of parallel equal-width (of width b) opaque straight bars intermittantly separated by arrays of parallel equal-width (of width c) transparent bars such as a Ronchi ruling (when B=c) or, in general, a plane of diffraction gratings. A thin piece of light-sensitive material 1 such as photographic film or glass plate is fixed to a micrometer 4 controlled translation state 3. The light-sensitive side of the light-sensitive material is placed in close contact with the ruling side of the ruling mask 2. On the other side of the ruling mask 2, a light source 6 which can be turned on and off is placed. First the light-sensitive material 1 is exposed by the light source 6 through the mask 2 while the film 1 is in its initial position. The light sensitive material 1 is then translated by the micrometer 4 a distance d of a non-integral multiple or a fraction of the distance $$\frac{a}{2\sin\theta},$$

where $a=b+c$ relative to and along a direction in the plane of the ruling mask; the said direction making a non-zero angle $\theta$ (for example, 90 degrees) to the parallel direction of the ruling bars. Then another exposure is made by turning the light on for another predetermined period of time $T_2$. This exposure and translation process is repeated a predetermined non-zero number of times. Afterwards, the exposed light-sensitive material is developed. The developed light sensitive material will have a periodic array (of period $b+c$) of unit cells each consisting of an integral number (which is greater than one) of parallel straight lines each of which has a certain level of optical transmittance of a value between zero and one. The developed light-sensitive material is called a one-dimensional halftone contact screen since the optical transmittance varies along one direction only, i.e., the direction of the relative translation. In printing language, the contact screen is called a straight-line screen or simply a line screen.

If a piece of light sensitive material has first been placed through the above-described translation-exposure process with translation along one direction and then repeating the process at least one time after changing the orientation of the light-sensitive material relative to the mask rulings (of the same or a different ruling mask), in its original plane, by a non-zero angle $\phi$, between each process, and is then developed, the resulting light sensitive material should process a periodic array (with the period determined by the corresponding ruling masks used) of unit cells. Each of the unit cells has a greater than zero number of levels of optical transmittance. The developed light-sensitive material with the optical transmittance of its unit cells varying along more than one direction in the same plane is called two-dimensional halftone contact screen or is otherwise known as a halftone dot screen. If the process is repeated only one time the unit cells will consist of a matrix of identical parallelograms, each of the unit cells or parallelograms having a plurality of discrete and different optical transmittance levels. If the process is repeated more than one time, the unit cells will have the array of a matrix of other identical polygons.

Briefly stated, the invention has disclosed a translation-exposure method for making both line and dot halftone contact screens using the method of the invention, three examples of making particular halftone contact screens will now be described.

EXAMPLE 1

In this example, the line ruling mask has a periodic optical intensity transmittance function T(x) of period a:

$$T(x) = T(x + a), \text{ where;} \quad \text{(Equation 1)}$$
$$T(x) = 1, 0 < x \leq \frac{a}{n}$$
$$T(x) = 0, \frac{a}{n} < x \leq a$$
$$n \geq 2$$

In the making of the halftone contact screen as shown in FIG. 1 at the initial position of the light-sensitive material for example a piece of continuous tone photographic film, the film in close contact with the ruling mask is exposed through the mask by a uniform light source 6 for a time T1. After the exposure the film is translated along the x-direction for a distance of a/n. A second exposure of duration T2 is then made.

This process of stepping a distance a/n and exposing for a time T(i), continues until the (n−1)th translation and the $n^{th}$ exposure are completed. The spatial distribution of exposure becomes $$E(x) = p\, T(i), \; (i-1)a/n < x < i\, a/n, \quad \text{(Eq. 2)}$$

where i=1, 2, ..., n, and p is the local average light power per unit area. According to the Hurter-Driffield (H&D) curve, the developed film will have an optical density distribution D(x) expressed as $$D(x) = \gamma \log E(x) - D_o, \quad \text{(Eq. 3)}$$

provided E(x) is located in the linear region of the curve, where in Eq. (3) is the slope of the linear region of the curve, and $-D_0$ is the extrapolated value of density where the straight-line approximation would meet the D-axis. On the other hand, if some of E(x) were in the nonlinear region of the H&D curve of the film, Eq. (3) can no longer be applied over the whole range, but can be modified by letting $\gamma$ be a variable. In this latter case, a pre-calibration of the exposures can be used to assure that the desired optical density levels are achieved. The advantage of the approach described above is that various values of T(i) can be used to shape the periodic optical transmittance or density distribution of the halftone screen to any predetermined form. After development, the film becomes a one-dimensional (line) half-tone contact screen. It should be noted that, in general, optical transmittance T(x) is related to D(x) by: $T(x) = 10^{-D(x)}$.

EXAMPLE 2

Figure 2A:
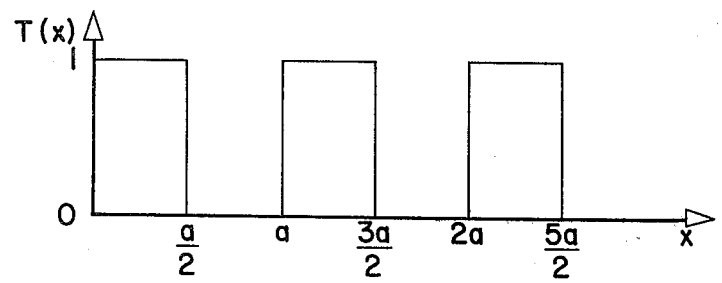
FIG. 2A illustrates a Ronchi ruling transmittance function prior to translation.
Figure 2B:
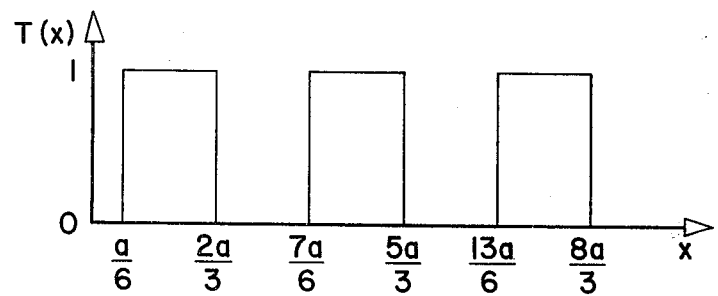
FIG. 2B illustrates a Ronchi ruling transmittance function with a translation of the film plate.
Figure 2C:
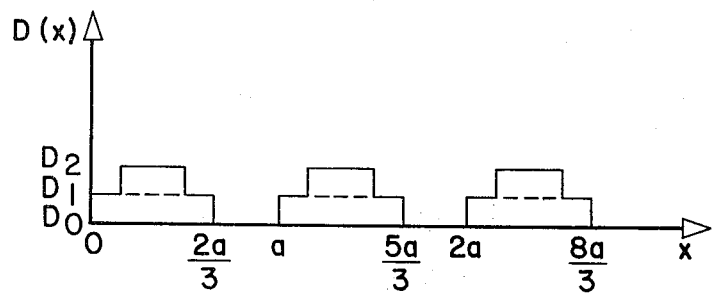
FIG. 2C is a transmittance function of the resultant halftone contact screen due to multiple exposures through the Ronchi ruling mask.

If the original line periodic mask has an optical intensity transmittance function T(x), similar to that of a Ronchi ruling shown in FIG. 2(a), which can be described by Eq. (1) with n=2, a different translation-exposure process can be used to obtain a halftone contact screen. An example is illustrated by FIG. 2(c), where a three level screen is generated. With the Ronchi ruling placed in close contact with a photographic film, as shown in FIG. 1, a first exposure by the light source is made. Then the plate is translated along x-direction an amount x=a/6, and a second exposure is made. After the photographic film is developed, its optical density profile is as shown in FIG. 2(c). The three levels of density are $D = D_0$ (fog level), $D_1$ and $D_2$ respectively. The density profile can be described as $$D(x) = D(x + a), \text{ and}$$
$$D(x) = D_1, 0 < x \leq a/6 \text{ and}$$
$$\quad\quad a/2 < x \leq 2a/3,$$
$$\quad = D_2, a/6 < x \leq a/2,$$
$$\quad = D_0, 2a/3 < x \leq a.$$

The densities $D_1$ and $D_2$ are dependent on the exposure and development times used. Even if the exposure times are equal and the exposure is in the linear region, $D_2 \neq 2D_1$ in general, due to the factor $D_0$ and possibly the variation of $\gamma$ in Eq. (3). Hence $D_1$ and $D_2$ can only be determined either by simultaneous calibration or by a posteriori measurement through the use of microdensitometer.

This method can be extended to fabricate an n-level screen by translating the film plate (n-2) times through a distance a/2n for a total number of (n-1) exposures. The optical density or transmittance profile of the developed film may be controlled by the light source intensity and exposure time involved.

A two-dimensional or dot halftone contact screen can be made by repeating the translation-exposure process after changing the orientation of the light-sensitive material relative to the ruling mask, in its original plane by a certain angle $\phi$, where $0° < \phi \leq 90°$, and then developing the light-sensitive material. An enlarged view of the density distribution function of a unit cell of a two-dimension or dot halftone contact screen made by this method, where $\phi = 90°$, is shown in FIG. 3. It can be seen that in the unit cell of this example there exist five different optical density or transmittance levels, denoted respectively by the numerals 2, 3, 4, 5, and 6, neglecting the reciprocity effect.

A typical screen for general use in a newspaper camera shop can be made with a Ronchi ruling mask having from 65 to 120 line pairs per inch (25 to 50 line pairs per centimeter). The width of the opaque line of such a ruling mask therefore, ranges from 1/50th cm. to 1/100th cm. The resultant halftone screen can have an overall size of 75 cm by 100 cm, or larger, and have 20 or more different discrete levels of optical transmittance in each unit cell.

EXAMPLE 3

It is important to note that the method can be easily applied with proper design to fabricate screens with cell patterns as described in the "Description of Preferred Embodiment" of U.S. Pat. No. 4,188,225 of Liu, entitled "Halftone Screens with Cell Matrix."

It should be understood that more than two translation-exposure sequences may be employed, creating unit areas of multiple levels of optical transmittance or density having more than four sides.

It should also be understood that this method is also appropriate for production of halftone contact screens having unit cells bounded by other than straight lines. That is, any periodic geometric shape of opaque bars may be used on the ruling mask.

Further, identical additional halftone contact screens may be produced by using a completed halftone contact screen first produced by my invention producing a negative of said first halftone contact screen, developing said negative, and exposing in successive processes, light-sensitive materials through said negative, developing said last mentioned light-sensitive materials as duplicates of said first produced halftone contact screen.

While the invention has been particularly shown and described with reference to preferred embodiments thereof, it will be understood by those skilled in the art that various changes in form and details may be made therein without departing from the spirit and scope of the invention.

What I claim is:

1. A method of manufacturing a halftone contact screen having a plurality of discrete different optical transmittance levels in each of its unit cells, comprising the steps of:
    (a) exposing a flat light-sensitive material through a ruling mask having an array of parallel periodic equal width opaque straight bars separated by an array of parallel equal width transparent bars for a first predetermined period of time while the ruling side of the ruling mask is in close contact with the light-sensitive side of the light sensitive material; and
    (b) translating the light-sensitive material relative to the ruling mask along a direction in the plane of the light-sensitive material making an angle $\theta$, where $0° < \theta \leq 90°$ effectively, to the direction of the parallel of the opaque bars a distance d such that the distance $d\sin\theta$ is a non-integral multiple of one-half of the sum of the widths of one opaque bar and one transparent bar; and
    (c) exposing said light-sensitive material through said mask for a second predetermined period of time; and
    (d) repeating said translation-exposure process a predetermined non-zero number of times; and
    (e) developing said light sensitive material producing a one-dimensional plurality of discrete different optical transmittance levels of straight-line patterns along one direction in the plane of the developed light-sensitive material.

2. A method of manufacturing a two-dimensional halftone contact screen having a plurality of discrete optical transmittance levels in each of its unit cells, comprising the steps of:
    (a) exposing a flat light-sensitive material through a ruling mask having an array of parallel periodic equal width opaque straight bars separated by an array of parallel equal width transparent bars for a first predetermined period of time while the ruling side of the ruling mask is in close contact with the light-sensitive side of the light sensitive material; and
    (b) translating the light-sensitive material relative to the ruling mask along a direction in the plane of light-sensitive material making an angle $\theta$, where $0° < \theta \leq 90°$ effectively, to the direction of the parallel of the opaque bars a distance d such that the distance $d\sin\theta$ is a non-integral multiple of one-half of the sum of the widths of one opaque bar and one transparent bar; and
    (c) exposing said light-sensitive material through said mask for a second predetermined period of time; and,
    (d) repeating said translation-exposure process a predetermined non-zero number of times; and
    (e) changing the orientation of the light-sensitive material in its own plane relative to the ruling mask an angle $\phi$, where $0° < \phi \leq 90°$, effectively; and,
    (f) repeating said steps (a) through (d) above, and
    (g) developing said light-sensitive material, producing a two-dimensional halftone contact screen consisting of a matrix of identical parallelograms on the developed light-sensitive material, each of the said parallelograms having a plurality of discrete and different optical transmittance levels.

3. A method of manufacturing a two-dimensional halftone contact screen having a plurality of discrete different optical transmittance levels in each of its unit cells, comprising the steps of:
    (a) exposing a flat light-sensitive material through a ruling mask having an array of parallel periodic equal width opaque straight bars separated by an array of parallel equal width transparent bars for a first predetermined period of time while the ruling side of the ruling mask is in close contact with the light-sensitive side of the light sensitive material; and
    (b) translating the light-sensitive material relative to the ruling mask along a direction in the plane of the light-sensitive material making an angle $\theta$, where $0° < \theta \leq 90°$ effectively, to the direction of the parallel of the opaque bars a distance d such that the distance $d\sin\theta$, is a non-integral multiple of one-half of the sum of the widths of one opaque bar and one transparent bar; and
    (c) exposing said light-sensitive material through said mask for a second predetermined period of time; and
    (d) repeating said translation-exposure process a predetermined non-zero number of times; and
    (e) changing the orientation of the light-sensitive material in its own plane relative to the ruling mask an angle $\phi$, where $0° < \phi \leq 90°$, effectively; and
    (f) repeating said steps (a) through (d) above; and
    (g) further repeating said step (e) with angle $\phi$ different from any previous angle $\phi$, and said step (f) at least one further time; and
    (h) developing said light-sensitive material, producing a two-dimensional halftone contact screen consisting of a matrix of identical polygons on the developed light-sensitive element, each of said polygons having a plurality of discrete and different optical transmittance levels.

4. The method of claim 2 wherein said angle $\phi$ is 90°.

5. The method of claim 1 wherein said ruling mask comprises opaque bars each having a width equal to the width of each of the transparent bars.

6. The method of claim 2 wherein said ruling mask comprises opaque bars each having a width equal to the width of each of the transparent bars.

7. The method of claim 3 wherein said ruling mask comprises opaque bars each having a width equal to the width of each of the transparent bars.

8. The method of claim 5 wherein N equal distance translations are taken over a distance $\omega$, said distance $\omega$ being the sum of the widths of one opaque bar and one transparent bar, and each translation equally $\omega$, N being a positive integer greater than one.

9. The method of claim 1 wherein N unequal-distance translations are taken, making a total translation distance of $\omega/2$, $\omega$ being the sum of the widths of one opaque bar and one transparent bar, N being a positive integer greater than 1.

10. The method of claim 1 wherein the widths of the opaque bars are greater than the widths of the transparent bars.

11. The method of claim 1 wherein the widths of the transparent bars are greater than the widths of the opaque bars.

12. The method of claim 1 wherein N equal-distance translations are taken, $N \geq 2$, making a total translation distance equal to the distance between the adjacent edges of two neighboring opaque bars.

13. The method of claim 1 wherein each translation distance is greater than the sum of the widths of one opaque bar and one transparent bar.

14. The method of claim 1 wherein said light-sensitive material comprises a flat piece of continuous tone film.

15. The method of claim 1 wherein said light-sensitive material comprises a flat piece of glass film plate.

16. The method of claim 1 wherein a plurality of said halftone contact screens may be further produced by exposing a light-sensitive material through the halftone contact screen first produced, producing a negative of said first halftone contact screen, developing said negative, and exposing in successive processes, light-sensitive materials through said negative, developing said last mentioned light-sensitive materials as duplicates of said first produced halftone contact screen.

17. The method of claim 2 wherein a plurality of said halftone contact screens may be further produced by exposing a light-sensitive material through the halftone contact screen first produced, producing a negative of said first halftone contact screen, developing said negative, and exposing in successive processes light-sensitive materials through said negative developing said last mentioned light-sensitive materials as duplicates of said first produced halftone contact screen.

18. The method of claim 3 wherein a plurality of said halftone contact screens may be further produced by exposing a light-sensitive material through the halftone contact screen first produced, producing a negative of said first halftone contact screen, developing said negative, and exposing in successive processes light-sensitive materials through said negative, developing said last mentioned light-sensitive materials as duplicates of said first produced halftone contact screen.

19. The method of manufacturing a halftone contact screen having a plurality of discrete different optical transmittance levels in each of its unit cells, comprising the steps of:

(a) exposing a light-sensitive material through a ruling mask having a periodic array of opaque geometrically-shaped bars bounded by other than straight lines separated by transparent interstices for a first predetermined period of time while the ruling side of the mask is in close contact with the light-sensitive side of the light-sensitive material; and (b) translating the light-sensitive material relative to the ruling mask along a direction in the plane of the light-sensitive material an amount such that the said mask is offset with respect to its original position a distance equal to a non-integral multiple of ½ of the periodic distance of the said geometrically-shaped bars; and (c) exposing said light-sensitive material through said mask for a second predetermined period of time; and (d) repeating said translation-exposure process a predetermined non-zero number of times; and (e) Selectably repeating the translation-exposure process of said steps (a) through (d) above Q times where Q is any integer including zero, and wherein the orientation of said light-sensitive material, in the plane of the material, relative to the said ruling mask, is changed by an angle $\phi$, $0° < \phi \leq 90°$, effectively, between each translation-exposure process; and (f) developing said light-sensitive material, producing a one-dimensional screen when Q is zero and a two-dimensional halftone screen when Q is greater than zero consisting of a matrix of identical geometric shapes on the developed light-sensitive material, each of said geometric shapes having a plurality of discrete and different optical density levels.

* * * * *